(12) United States Patent
Wu et al.

(10) Patent No.: US 10,591,547 B2
(45) Date of Patent: Mar. 17, 2020

(54) SOLID STATE CIRCUIT BREAKER AND MOTOR DRIVING SYSTEM

(71) Applicant: GENERAL ELECTRIC COMPANY, Schenectady, NY (US)

(72) Inventors: Tao Wu, Shanghai (CN); Fei Li, Shanghai (CN); Changjin Liu, Shanghai (CN)

(73) Assignee: GENERAL ELECRIC COMPANY, Schenectady, NY (US)

( * ) Notice: Subject to any disclaimer, the term of this patent is extended or adjusted under 35 U.S.C. 154(b) by 128 days.

(21) Appl. No.: 15/669,384

(22) Filed: Aug. 4, 2017

(65) Prior Publication Data

US 2018/0045783 A1   Feb. 15, 2018

(30) Foreign Application Priority Data

Aug. 12, 2016   (CN) .......................... 2016 1 0666183

(51) Int. Cl.
  *G01R 31/02*   (2006.01)
  *G01R 31/327*   (2006.01)
  (Continued)

(52) U.S. Cl.
  CPC ....... *G01R 31/3277* (2013.01); *H02H 1/0007* (2013.01); *H02H 3/044* (2013.01);
  (Continued)

(58) Field of Classification Search
  CPC ............ G01R 31/3277; G01R 31/3272; G01R 31/2621; H02H 3/023; H02H 3/044; H02H 7/122; H02H 7/1222; H02H 7/0833
  See application file for complete search history.

(56) References Cited

U.S. PATENT DOCUMENTS 5,286,933 A   2/1994  Pham
5,586,156 A   12/1996 Gaubatz
(Continued)

FOREIGN PATENT DOCUMENTS

CA   101820162 A   9/2010
CN   101515520 B   5/2012
(Continued)

OTHER PUBLICATIONS

Miao et al., "A Self-Powered Ultra-Fast Dc Solid State Circuit Breaker Using A Normally-On SIC JFET", Applied Power Electronics Conference and Exposition (APEC), pp. 767-773, Mar. 2015.

(Continued)

*Primary Examiner* — Thang X Le
(74) *Attorney, Agent, or Firm* — Meagher Emanuel Laks Goldberg & Liao, LLP

(57) ABSTRACT

A solid state circuit breaker, including a solid state switch, an inductor connected with the solid state switch in series and a fault detection circuit. The solid state switch has a gate electrode, a source electrode and a drain electrode. The fault detection circuit is used for detecting health status of the solid state switch and identifying fault type of the solid state switch in a condition that a fault occurs on the solid state switch based on one or more of a measured voltage between the source electrode and the drain electrode of the solid state switch, a measured voltage of two terminals of the inductor, a reference voltage and a switching control signal provided to the gate electrode of the solid state switch. A motor driving system having the solid state circuit breaker is further disclosed.

20 Claims, 6 Drawing Sheets

(51) Int. Cl.
*H02H 3/04* (2006.01)
*H02H 7/08* (2006.01)
*H03K 17/18* (2006.01)
*H02H 1/00* (2006.01)
*G01R 31/26* (2020.01)

(52) U.S. Cl.
CPC ........ *H02H 7/0822* (2013.01); *H02H 7/0833* (2013.01); *H03K 17/18* (2013.01); *G01R 31/2621* (2013.01)

(56) References Cited

U.S. PATENT DOCUMENTS

| | | | | |
|---|---|---|---|---|
| 8,981,740 | B2* | 3/2015 | van den Broeke | H02M 3/158 323/222 |
| 2004/0095112 | A1* | 5/2004 | Kernahan | H02M 1/0845 323/282 |
| 2005/0280404 | A1* | 12/2005 | LeFevre | H02M 3/1584 323/282 |
| 2008/0048877 | A1 | 2/2008 | Takahashi | |
| 2009/0206059 | A1 | 8/2009 | Kiko | |
| 2009/0310270 | A1* | 12/2009 | Burns | H02H 3/066 361/90 |
| 2010/0039735 | A1* | 2/2010 | Trescases | H02M 3/1588 361/18 |
| 2010/0085074 | A1* | 4/2010 | Yinn | G01R 31/025 324/764.01 |
| 2010/0244800 | A1* | 9/2010 | Nakamura | H02M 1/32 323/284 |
| 2011/0298276 | A1 | 12/2011 | Takahashi et al. | |
| 2013/0077204 | A1* | 3/2013 | Berggren | H02H 7/268 361/102 |
| 2014/0104068 | A1 | 4/2014 | Webb | |
| 2014/0277802 | A1* | 9/2014 | Tomas | G06F 1/30 700/292 |
| 2015/0002975 | A1 | 1/2015 | Rozman et al. | |
| 2016/0195582 | A1 | 7/2016 | Voß | |
| 2017/0146583 | A1* | 5/2017 | Baik | G01R 31/025 |

FOREIGN PATENT DOCUMENTS

| | | |
|---|---|---|
| CN | 1430317 A | 10/2013 |
| CN | 103337835 A | 10/2013 |
| CN | 103713258 A | 4/2014 |
| CN | 105207361 A | 12/2015 |
| CN | 107346765 A | 11/2017 |
| JP | H09222448 A | 8/1997 |
| WO | 2015/181112 A1 | 12/2015 |

OTHER PUBLICATIONS

Extended European Search Report and Opinion issued in connection with corresponding EP Application No. 17184847.6 dated Dec. 22, 2017.
English Translation of Chinese Search Report for corresponding CN Application No. 201610666183, dated Aug. 27, 2018.
English Translation of Chinese First Office Action for corresponding CN Application No. 201610666183, dated Sep. 4, 2018.
English Translation of Chinese Second Office Action for corresponding CN Application No. 201610666183, dated May 10, 2019.
English Translation of Chinese Third Office Action for corresponding CN Application No. 201610666183, dated Dec. 19, 2019.

* cited by examiner

SOLID STATE CIRCUIT BREAKER AND MOTOR DRIVING SYSTEM

FIELD OF INVENTION

Embodiments of the present invention generally relate to a circuit breaker, particularly to a solid state circuit breaker with a function of fault self-diagnosing and a motor driving system having the solid state circuit breaker with the function of fault self-diagnosing.

BACKGROUND OF THE INVENTION

The circuit breaker is the most important control device in an electrical power system, and is also a device that actions most frequently. The function of the circuit breaker is switching off and switching on the load circuit. And when a fault such as over-loading, short circuit, under-voltage and the like occurs on a circuit, the circuit breaker can automatically break the circuit, playing a role of protection, preventing the accident from becoming worse, and ensuring safe operation.

A solid state circuit breaker is a new power-electronic-device-based switch device with no break, so it has a speed of action far faster than a traditional mechanical breaker, and its time of action is at a microsecond level, which can accurately switch the circuit off or on at a specified phase of voltage or current, thus can satisfy the strict requirements of micro power grid on switch devices. With the use of a fault current limiter, the solid state circuit breaker can cut off the faulty line before the short circuit current has significantly increased, thus improving stability of the power grid largely.

However, the breaker has a higher failure rate during operation. Once a fault occurs on the breaker, it will very easily lead to a power grid accident and cause a huge economic loss.

Therefore, it is necessary to provide with a breaker with a function of fault self-diagnosing.

SUMMARY OF THE INVENTION

One aspect of embodiments of the present invention is to provide a solid state circuit breaker. The solid state circuit breaker comprises a solid state switch, an inductor connected with the solid state switch in series and a fault detection circuit. The solid state switch has a gate electrode, a source electrode and a drain electrode. The fault detection circuit is used to detect health status of the solid state switch and identify fault type of the solid state switch in a condition that a fault occurs on the solid state switch based on one or more of a measured voltage between the source electrode and the drain electrode of the solid state switch, a measured voltage of two terminals of the inductor, a reference voltage and a switching control signal provided to the gate electrode of the solid state switch.

Another aspect of embodiments of the present invention is to provide a motor driving system. The motor driving system comprises an electrical motor, a power source for providing a DC voltage, a DC bus capacitor connected with the power source in parallel, a DC/AC converter for converting the DC voltage to an AC voltage and providing the AC voltage to the electrical motor, and a solid state circuit breaker as mentioned above.

BRIEF DESCRIPTION OF THE DRAWINGS

Embodiments of the present invention can be understood better in light of the following detailed description with reference to the accompanying drawings, in which the same reference signs represent the same components in the whole drawings, in which.

DETAILED DESCRIPTION OF THE INVENTION

In order to help the person skilled in the art to exactly understand the subject matters claimed by embodiments of the present invention, detailed description for embodiments of the present invention will be given with reference to the accompanying drawings in the following. In the following detailed description for those embodiments, some known functions or structures will not be described in details by the Description, to avoid disclosure of the present invention to be affected by unnecessary details.

Unless defined otherwise, the technical or scientific terms used in the Claims and the Description should have meanings as commonly understood by one of ordinary skilled in the art to which the present disclosure belongs. The terms "first", "second" and the like in the present Description and Claims do not mean any sequential order, quantity or importance, but are only used for distinguishing different components. The terms "a", "an" and the like do not denote a limitation of quantity, but denote the existence of at least one. The terms "comprises", "comprising", "includes", "including" or "has", "have", "having" and the like mean that the element or object in front of the "comprises", "comprising", "includes", "including", "has", "have" and "having" covers the elements or objects and their equivalents illustrated following the "comprises", "comprising", "includes", "including", "has", "have" and "having", without excluding other elements or objects. The terms "coupled", "connected" and the like are not limited to being connected physically or mechanically, but may comprise electric connection, no matter directly or indirectly.

Figure 1:
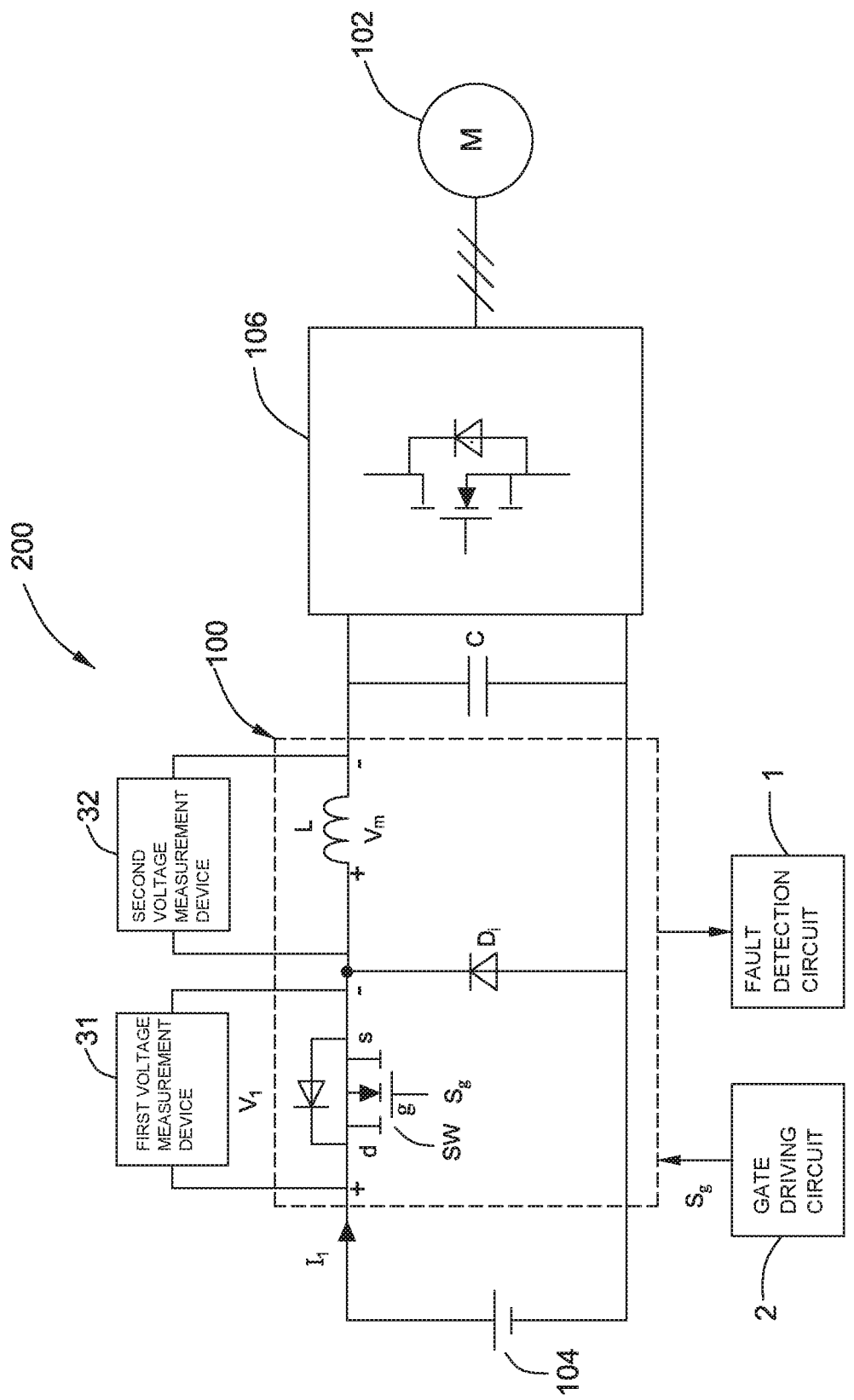
FIG. 1 is a schematic diagram of a motor driving system having a solid state circuit breaker with a function of fault self-diagnosing according to an embodiment of the present invention.

FIG. 1 shows a schematic diagram of a schematic motor driving system 200 according to an embodiment of the present invention. As shown in FIG. 1, the schematic motor driving system 200 comprises an electrical motor 102, a power source 104 for providing a DC voltage, a DC bus capacitor C connected with the power source 104 in parallel, a DC/AC converter 106 connected between the DC bus capacitor C and the electrical motor 102, and a solid state circuit breaker 100 connected between the power source 104 and the DC/AC converter 106. The DC/AC converter 106 may convert a DC voltage to an AC voltage, and provides the AC voltage to the electrical motor 102.

In embodiments of the present invention the solid state circuit breaker 100 has a function of fault self-diagnosing, and comprises a solid state switch SW, an inductor L connected with the solid state switch SW in series, a fly-wheel diode $D_f$ and a fault detection circuit 1. The solid state switch SW may, for example, comprise a metal-oxide-semiconductor field effect transistor (MOSFET). The solid state switch SW may also comprise an insulated gate bipolar transistor (IGBT) or an integrated gate commutated thyristor (IGCT). The solid state switch SW has a gate electrode g, a source electrode s and a drain electrode d.

The solid state circuit breaker 100 may also include a gate driving circuit 2, a first voltage measurement device 31 and a second voltage measurement device 32. The gate driving circuit 2 is used to supply a switching control signal $S_g$ to the gate electrode g of the solid state switch SW. The first voltage measurement device 31 is used to measure a voltage $V_1$ between the source electrode s and the drain electrode d of the solid state switch SW. The second voltage measurement device 32 is used to measure a voltage $V_m$ of two terminals of the inductor L.

Figure 2:
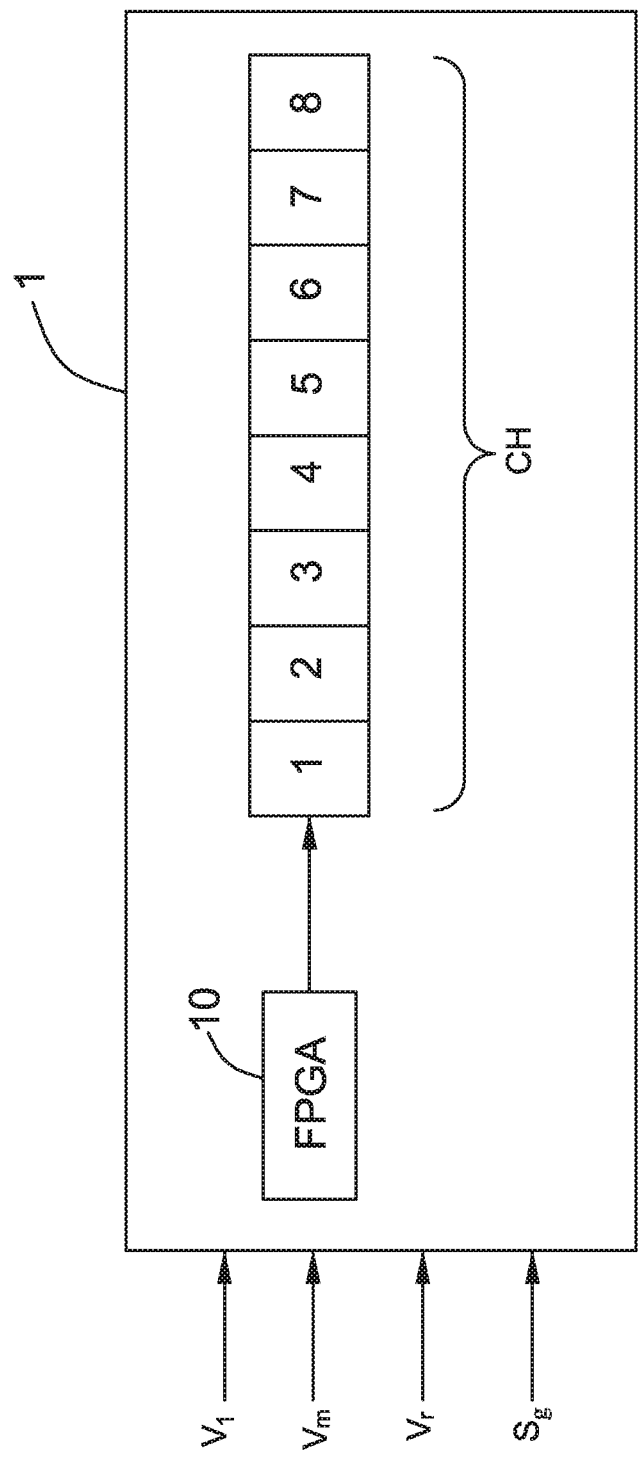
FIG. 2 is a schematic diagram of a fault detection circuit in the solid state circuit breaker as shown in FIG. 1.

As shown in FIG. 2, the fault detection circuit 1 may receive a reference voltage $V_r$ that may be a little greater than a threshold voltage between the source electrode s and the drain electrode d of the solid state switch SW. The fault detection circuit 1 may detect health status of the solid state switch SW and identify fault type of the solid state switch SW in the condition that a fault occurs on the solid state switch SW based on one or more of the measured voltage V1 between the source electrode s and the drain electrode d of the solid state switch SW, the measured voltage $V_m$ of two terminals of the inductor, the reference voltage $V_r$ and the switching control signal $S_g$ provided to the gate electrode g of the solid state switch SW. In embodiments of the present invention the fault detection circuit 1 may be implemented in software, hardware or combination thereof.

Continuing to refer to FIG. 2, as an example, the fault detection circuit 1 may comprise a field programmable gate array (FPGA) 10 for outputting a string of codes CH. The fault detection circuit 1 may detect health status and fault type of the solid state switch SW according to the string of codes CH. In embodiments of the present invention, the fault detection circuit 1 may detect whether a fault such as over-heat, short circuit or open circuit occurs on the solid state switch SW according to the string of codes CH. For example, the string of codes CH may be an eight-bit code. In one embodiment, the first bit of the code CH may be used to represent health status of the solid state switch SW, and the last four bits, i.e., fifth to eighth bits, of the code CH may be used to present fault type of the solid state switch SW. And the middle second to fourth bits of the code CH are spare bits, which may be used to indicate other features of the solid state switch SW and may be defined according to the user's need. For instance, when the first bit of the code CH is 0, it indicates that the solid state switch SW is in a normal status; and when the first bit is 1, it indicates that a fault occurs on the solid state switch SW. The fifth bit of the code CH may represent whether a fault of over-heat occurs on the solid state switch SW. For example, when the fifth bit is 0, it indicates that no fault of over-heat occurs on the solid state switch SW; and when the fifth bit is 1, it indicates that a fault of over-heat occurs on the solid state switch SW. The sixth bit of the code CH may represent whether a fault of short circuit occurs on the solid state switch SW. For example, when the sixth bit is 0, it indicates that no fault of short circuit occurs on the solid state switch SW; and when the sixth bit is 1, it indicates that a fault of short circuit occurs on the solid state switch SW. The seventh and eighth bits of the code CH may represent whether a fault of open circuit occurs on the solid state switch SW. For example, when the seventh and eighth bits are both 1, it indicates that no fault of open circuit occurs on the solid state switch SW; and when the seventh bit is 0 and the eighth bit is 1, it indicates that a fault of open circuit occurs on the solid state switch SW. The bit numbers of the code CH and their representing meanings, and the meanings of the high and low logic levels of the respective bit as mentioned above are set merely for explaining the code of embodiments of the present invention, rather than restricting embodiments of the present invention, which may be defined according to requirements of different users.

Figure 3:
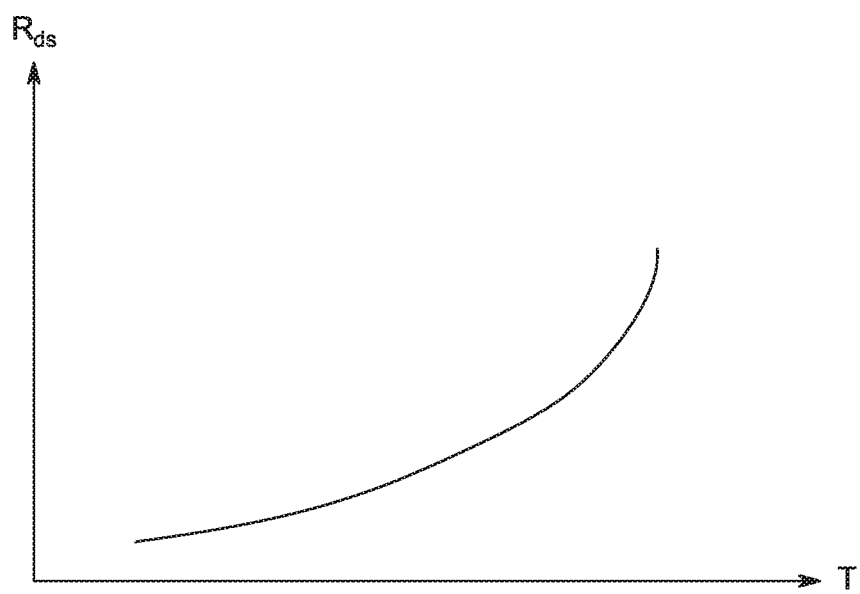
FIG. 3 is a graph showing a curve of a resistance between a source electrode and a drain electrode of a solid state switch versus a temperature of the solid state switch in the solid state circuit breaker as shown in FIG. 1.

In embodiments of the present invention, the solid state circuit breaker 100 may detect whether a fault of over-heat occurs on the solid state switch SW. Hereinafter, with combined reference to FIG. 1 and FIG. 3, it will be described in details how the solid state circuit breaker 100 detects whether a fault of over-heat occurs thereon by the fault detection circuit 1. FIG. 3 shows a graph of a curve of a resistance $R_{ds}$ between the source electrode s and the drain electrode d of the solid state switch SW versus a temperature T of the solid state switch SW (referred to as $R_{ds}$-T curve). It can be seen from FIG. 3 that the resistance $R_{ds}$ between the source electrode s and the drain electrode d of the solid state switch SW will increase as the temperature T of the solid state switch SW increases. And it is known that in the condition that the solid state switch SW is closed, the relationship between the voltage $V_1$ between the source electrode s and the drain electrode d of the solid state switch SW and the resistance $R_{ds}$ between the source electrode s and the drain electrode d of the solid state switch SW is as follows:

$$V_1 = R_{ds} \times I_1 \qquad (1)$$

wherein $I_1$ represents the current flowing through the source electrode s and the drain electrode d of the solid state switch SW. In the condition that the driving current required by the electrical motor 102 is constant, $I_1$ is constant.

Therefore, from the $R_{ds}$-T curve of FIG. 3 and the above Equation (1), it can be concluded that the voltage $V_1$ between the source electrode s and the drain electrode d of the solid state switch SW is in positive proportion to the temperature T of the solid state switch SW.

In embodiments of the present invention the fault detection circuit 1 may detect whether over-heat occurs on the solid state switch SW based on the measured voltage $V_1$ between the source electrode s and the drain electrode d of the solid state switch SW, the switching control signal $S_g$ and the curve of the resistance $R_{ds}$ between the source electrode s and the drain electrode d of the solid state switch SW versus the temperature T of the solid state switch SW. In the condition that the switching control signal $S_g$ provided to the gate electrode g of the solid state switch SW is a high level, when the measured voltage $V_1$ between the source electrode s and the drain electrode d of the solid state switch SW is greater than a predetermined voltage threshold, the first bit of the code CH is output as 1, and the fifth bit of the code CH is also output as 1. Therefore, at this moment, the fault detection circuit 1 may detect that a fault of over-heat occurs on the solid state switch SW.

In embodiments of the present invention, the solid state circuit breaker 100 may detect whether a fault of short circuit occurs on the solid state switch SW. The fault detection circuit 1 may detect whether short circuit occurs on the solid state switch SW based on the measured voltage $V_1$ between the source electrode s and the drain electrode d of the solid state switch SW and the switching control signal $S_g$. In the condition that the switching control signal $S_g$ is a low level, when the measured voltage $V_1$ between the source electrode s and the drain electrode d of the solid state switch SW is zero, the first bit of the code CH is output as 1, and the sixth bit of the code CH is also output as 1. Therefore, at this moment, the fault detection circuit 1 may detect that a fault of short circuit occurs on the solid state switch SW.

Figure 4:
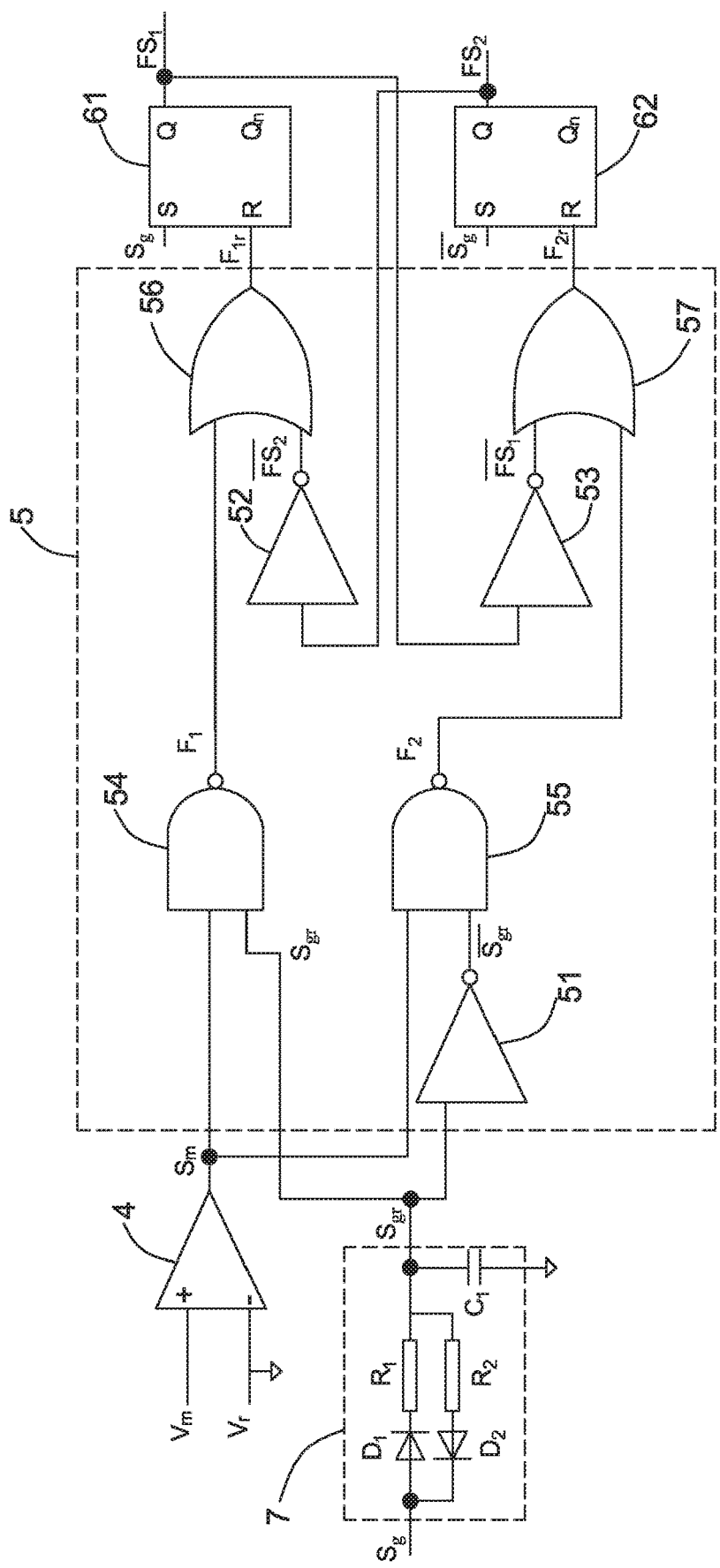
FIG. 4 is a schematic diagram of a fault detection circuit for detecting a fault of open circuit of an embodiment of the present invention.

In embodiments of the present invention, the solid state circuit breaker 100 may detect whether a fault of open circuit occurs on the solid state switch SW. Hereinafter, with reference to FIG. 1 in combination with FIG. 4 to FIG. 6, it will be described in details how the solid state circuit breaker 100 detects whether a fault of open circuit occurs thereon by the fault detection circuit 1. The fault detection circuit 1 detects whether open circuit occurs on the solid state switch SW based on the measured voltage $V_m$ of two terminals of the inductor L, the reference voltage $V_r$ and the switching control signal $S_g$. FIG. 4 shows a schematic diagram of the fault detection circuit 1 according to embodiments of the present invention. As shown in FIG. 4, the fault detection circuit 1 may comprise a comparator 4, whose positive terminal (+) receives the measured voltage $V_m$ of two terminals of the inductor L, and whose negative terminal (−) receives the reference voltage $V_r$. The comparator 4 may compare the measured voltage $V_m$ of two terminals of the inductor L with the reference voltage $V_r$ to output a comparison result $S_m$. The fault detection circuit 1 detects occurrence of open circuit on the solid state switch SW based on the comparison result $S_m$ output by the comparator 4 and the switching control signal $S_g$.

The fault detection circuit 1 may further comprise a logic gate circuit 5, a first RS trigger 61 and a second RS trigger 62. The first RS trigger 61 may be connected with the comparator 4 via the logic gate circuit 5, and the second RS trigger 62 may be connected with the switching control signal $S_g$ via the logic gate circuit 5. A reset terminal R of the first RS trigger 61 is connected with the logic gate circuit 5 and a set terminal S thereof is connected with the switching control signal $S_g$, and a reset terminal R of the second RS trigger 62 is connected with the logic gate circuit 5 and a set terminal S thereof is connected with a reverse switching control signal $\overline{S_g}$. The fault detection circuit 1 may detect whether open circuit occurs on the solid state switch SW according to logic levels of a result $FS_1$ output by the output terminal Q of the first RS trigger 61 and a result $FS_2$ output by the output terminal Q of the second RS trigger 62.

In one example, the logic gate circuit 5 may comprise a first NOT gate 51, a second NOT gate 52, a third NOT gate 53, a first NAND gate 54, a second NAND gate 55, a first OR gate 56 and a second OR gate 57.

In embodiments of the present invention, the fault detection circuit 1 may further comprise a delay circuit 7 for delaying the switching control signal $S_g$ to obtain a delayed switching control signal $S_{gr}$. The fault detection circuit 1 detects the solid state switch SW based on the measured voltage $V_m$ of two terminals of the inductor L, the reference voltage $V_r$ and the delayed switching control signal $S_{gr}$.

The delay circuit 7 comprises a first branch (not indicated) and a second branch (not indicated) which are connected in parallel, and a capacitor $C_1$ connected with the first and the second branches. The first branch comprises a first diode $D_1$ and a first resistor $R_1$ which are connected in series, the second branch comprises a second diode $D_2$ and a second resistor $R_2$ which are connected reversely and in series. The resistance of the first resistor $R_1$, the resistance of the second resistor $R_2$ and the capacitance of the capacitor $C_1$ are relevant with delay of the solid state switch SW's switching on and off.

Continuing to refer to FIG. 4, the first NOT gate 51 has an input terminal connected with the switching control signal $S_g$. In this embodiment, the input terminal of the first NOT gate 51 is connected with the delayed switching control signal $S_{gr}$. The delayed switching control signal $S_{gr}$ outputs $\overline{S_{gr}}$ through the first NOT gate 51.

The first NAND gate 54 has a first input terminal connected with the output terminal of the comparator 4, and a second input terminal connected with the switching control signal $S_g$ (the delayed switching control signal $S_{gr}$ in this embodiment). The comparison result $S_m$ output by the comparator 4 and the delayed switching control signal $S_{gr}$ are output as $F_1$ through the first NAND gate 54.

The second NAND gate 55 has a first input terminal connected with the output terminal of the comparator 4, and a second input terminal connected with an output terminal of the first NOT gate 51. The comparison result $S_m$ output by the comparator 4 and the result $\overline{S_{gr}}$ output by the first NOT gate 51 are output as $F_2$ through the second NAND gate 55.

The second NOT gate 52 has an input terminal connected with the output terminal Q of the second RS trigger 62. The result $FS_2$ output by the output terminal Q of the second RS trigger 62 is output as $\overline{FS_2}$ through the second NOT gate 52.

The third NOT gate 53 has an input terminal connected with the output terminal Q of the first RS trigger 61. The result $FS_1$ output by the output terminal Q of the first RS trigger 61 is output as $\overline{FS_1}$ through the third NOT gate 53.

The first OR gate 56 has a first input terminal connected with an output terminal of the first NAND gate 54, a second input terminal connected with an output terminal of the second NOT gate 52, and an output terminal connected with the reset terminal R of the first RS trigger. The result $F_1$ output by the first NAND gate 54 and the result $\overline{FS_2}$ output by the second NOT gate 52 are output as $F_{1r}$ through the first OR gate 56.

The second OR gate 57 has a first input terminal connected with an output terminal of the third NOT gate 53, a second input terminal connected with an output terminal of the second NAND gate 55, and an output terminal connected with the reset terminal R of the second RS trigger 62. The result $\overline{FS_1}$ output by the third NOT gate 53 and the result $F_2$ output by the second NAND gate 55 are output as $F_{2r}$ through the second OR gate 57.

Figure 5:
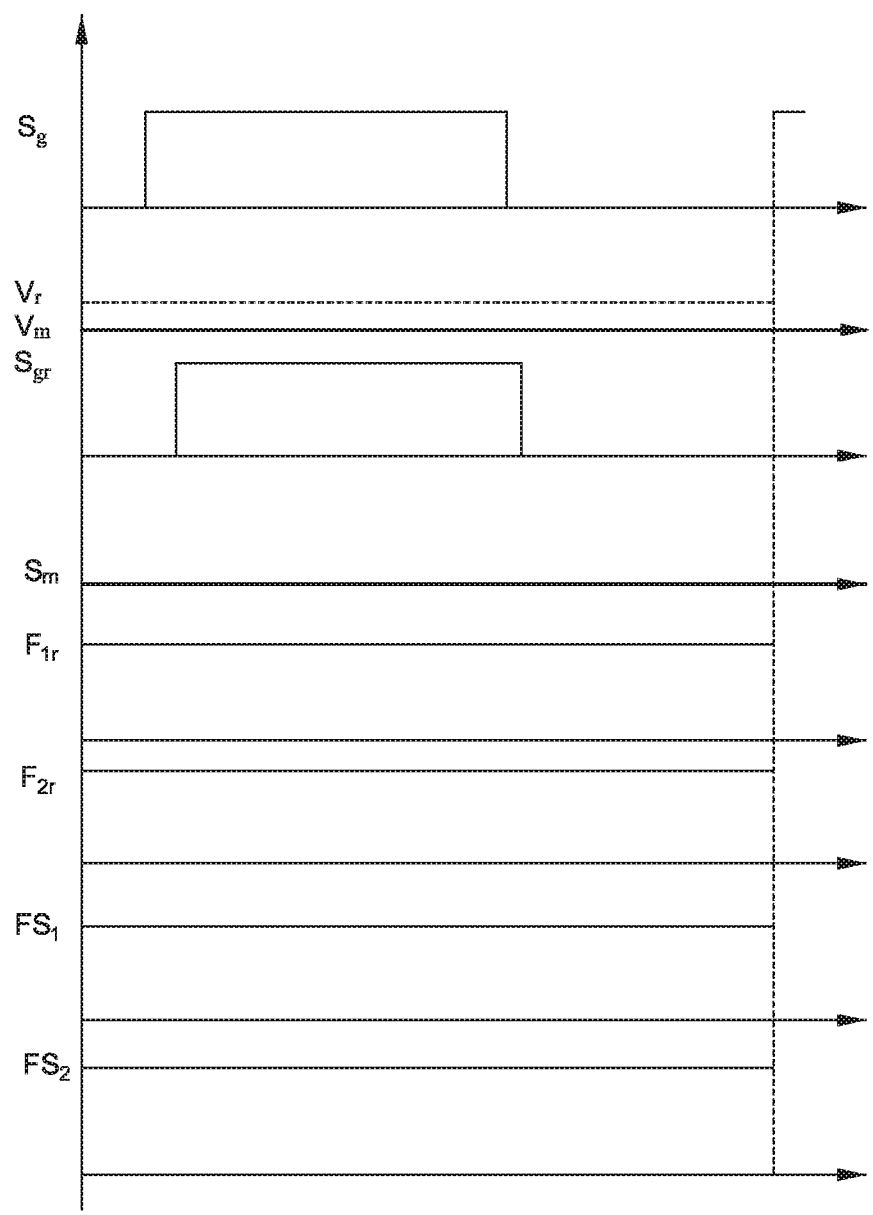
FIG. 5 is a waveform graph of the fault detection circuit as shown in FIG. 4 in a condition that the solid state circuit breaker is normal.
Figure 6:
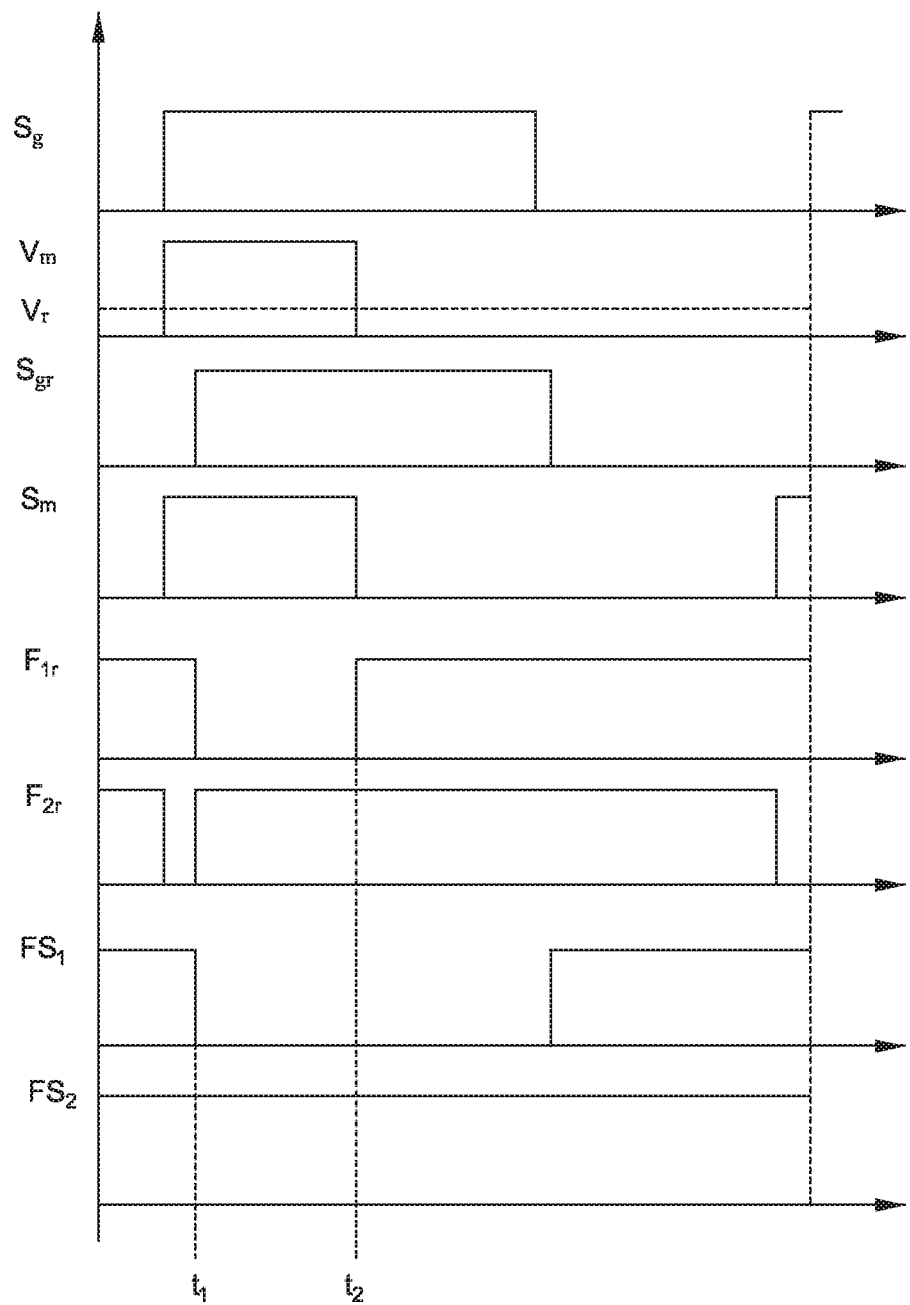
FIG. 6 is a waveform graph of the fault detection circuit as shown in FIG. 4 in a condition that open circuit occurs on the solid state circuit breaker.

FIG. 5 and FIG. 6 show waveform graphs of the fault detection circuit 1 in the condition that the solid state circuit breaker 100 is normal and in the condition that open circuit occurs on the solid state circuit breaker 100 respectively. The following Table 1 is a truth table of the first RS trigger 61 and the second RS trigger 62. Hereinafter, with reference to FIG. 4 in combination with FIGS. 5, 6 and Table 1, it will be described in details how the fault detection circuit 1 achieves fault detection.

TABLE 1

Truth Table of the first and second RS triggers 61, 62

| S | R | Q | $Q_n$ |
|---|---|---|---|
| 1 | 0 | 0 | 1 |
| 0 | 1 | 1 | 0 |
| 0 | 0 | 1 | 1 |
| 1 | 1 | Kept | Kept |

With reference to FIG. 4 and FIG. 5, in the condition that the solid state circuit breaker 100 is normal, when the switching control signal $S_g$ is a high level of 1, the value of the voltage $V_m$ of the two terminals of the inductor L is less than the reference voltage $V_r$. At this moment, the result $S_m$ output by the comparator 4 is a low level of 0. In the condition that the switching control signal $S_g$ is a high level of 1, the delayed switching control signal $S_{gr}$ is also a high level of 1, therefore, the result $F_1$ output through the first NAND gate 54 is a high level of 1. The result $FS_2$ output by the output terminal Q of the second RS trigger 62 initially is set to be a high level of 1, therefore, the result $\overline{FS_2}$ output through the second NOT gate 52 is a low level of 0. Then, the result $F_{1r}$ output through the first OR gate 56 is a high level of 1, and $F_{1r}$ is connected to the reset terminal R of the first RS trigger 61, the set terminal S of the first RS trigger 61 is connected to the switching control signal $S_g$, therefore, in the condition that the set terminal S of the first RS trigger 61 is a high level of 1 and the reset terminal R of the first RS trigger 61 is a high level of 1, it can be concluded according to Table 1 that the result $FS_1$ output by the output terminal Q of the first RS trigger 61 is kept to be a high level of 1. The result $\overline{S_{gr}}$ output through the first NOT gate 51 by the delayed switching control signal $S_{gr}$ having a high level of 1 is a low level of 0, therefore, the result $F_2$ output through the second NAND gate 55 is a high level of 1. The result $FS_1$ output by the output terminal Q of the first RS trigger 61 initially is set to be a high level of 1, therefore, the result $\overline{FS_1}$ output through the third NOT gate 53 is a low level of 0. Then, the result $F_{2r}$ output through the second OR gate 57 is a high level of 1, and $F_{2r}$ is connected to the reset terminal R of the second RS trigger 62, the set terminal S of the second RS trigger 62 is connected to the reverse switching control signal $\overline{S_g}$, therefore, in the condition that the set terminal S of the second RS trigger 62 is a low level of 0 and the reset terminal R of the second RS trigger 62 is a high level of 1, it can be concluded according to Table 1 that the result $FS_2$ output by the output terminal Q of the second RS trigger 62 is a high level of 1.

With reference to the duration of $t_1$-$t_2$ in FIG. 4 and FIG. 6, in the condition that a fault of open circuit occurs on the solid state circuit breaker 100, when the switching control signal $S_g$ is a high level of 1, the value of the voltage $V_m$ of the two terminals of the inductor L is higher than the reference voltage $V_r$. At this moment, the result $S_m$ output by the comparator 4 is a high level of 1. In the condition that the switching control signal $S_g$ is a high level of 1, the delayed switching control signal $S_{gr}$ is also a high level of 1, therefore, the result $F_1$ output through the first NAND gate 54 is a low level of 0. The result $FS_2$ output by the output terminal Q of the second RS trigger 62 before the fault of open circuit occurs is a high level of 1, therefore, the result $\overline{FS_2}$ output through the second NOT gate 52 is a low level of 0. Then, the result $F_{1r}$ output through the first OR gate 56 is a low level of 0, and $F_{1r}$ is connected to the reset terminal R of the first RS trigger 61, the set terminal S of the first RS trigger 61 is connected to the switching control signal $S_g$, therefore, in the condition that the set terminal S of the first RS trigger 61 is a high level of 1 and the reset terminal R of the first RS trigger 61 is a low level of 0, it can be concluded according to Table 1 that the result $FS_1$ output by the output terminal Q of the first RS trigger 61 is a low level of 0. The result $\overline{S_{gr}}$ output through the first NOT gate 51 by the delayed switching control signal $S_{gr}$ having a high level of 1 is a low level of 0, therefore, the result $F_2$ output through the second NAND gate 55 is a high level of 1. The result $FS_1$ output by the output terminal Q of the first RS trigger 61 before the fault of open circuit occurs is a high level of 1, therefore, the result $\overline{FS_1}$ output through the third NOT gate 53 is a low level of 0. Then, the result $F_{2r}$ output through the second OR gate 57 is a high level of 1, and $F_{2r}$ is connected to the reset terminal R of the second RS trigger 62, the set terminal S of the second RS trigger 62 is connected to the reverse switching control signal $\overline{S_g}$, therefore, in the condition that the set terminal S of the second RS trigger 62 is a low level of 0 and the reset terminal R of the second RS trigger 62 is a high level of 1, it can be concluded according to Table 1 that the result $FS_2$ output by the output terminal Q of the second RS trigger 62 is a high level of 1.

Therefore, summing up, a logic diagnosis result for the fault detection circuit 1 as shown in Table 2 below may be obtained.

TABLE 2

| Health Status | $S_g$ | $S_m$ | $FS_1$ | $FS_2$ |
| --- | --- | --- | --- | --- |
| Normal | 1 | 0 | 1 | 1 |
| Open Circuit | 1 | 1 | 0 | 1 |

Based on the comparison result $S_m$ output by the comparator 4 and the switching control signal $S_g$, the result $FS_1$ output by the output terminal Q of the first RS trigger 61 and the result $FS_2$ output by the output terminal Q of the second RS trigger 62 may be obtained, and consequently it may be determined whether a fault of open circuit occurs on the solid state circuit breaker 100 based on the $FS_1$ and $FS_2$. In the embodiment, the result $FS_1$ output by the output terminal Q of the first RS trigger 61 and the result $FS_2$ output by the output terminal Q of the second RS trigger 62 may be used as the $7^{th}$ bit and the $8^{th}$ bit of the code CH.

It shall be noted that the comparator 4 and the various kinds of gate circuits herein only represent modules for achieving corresponding functions thereby, which are not limited to hardware manners, but may be implemented by software, hardware or combinations of the two.

In embodiments of the present invention the solid state circuit breaker 100 can diagnose health status of itself and determine fault type in a condition that a fault occurs.

Similarly, the motor driving system 200 of embodiments of the present invention can diagnose health status of the solid state circuit breaker 100 itself and determine fault type in a condition that a fault occurs on the solid state circuit breaker 100, thus preventing the electrical motor 102 from being damaged.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:
1. A solid state circuit breaker comprising:
    a solid state switch having a gate electrode, a source electrode, and a drain electrode;
    an inductor connected in series with the solid state switch;
    a gate driving circuit configured to supply a switching control signal to the gate electrode;

a voltage measurement device configured to measure a voltage between the source electrode and the drain electrode; and a fault detection circuit configured to detect whether an overheating fault occurs on the solid state switch based on the switching control signal and the measured voltage between the source electrode and the drain electrode, the overheating fault occurring when the switching control signal is a high level and the measured voltage between the source electrode and the drain electrode is greater than a predetermined voltage threshold.

2. The solid state circuit breaker of claim 1, wherein the fault detection circuit comprises a field programmable gate array for outputting a string of codes.

3. The solid state circuit breaker of claim 1, wherein the fault detection circuit detects whether the overheating fault occurs on the solid state switch based further on a curve of a resistance between the source electrode and the drain electrode versus a temperature of the solid state switch.

4. The solid state circuit breaker of claim 1, wherein the fault detection circuit is further configured to detect whether a short circuit occurs on the solid state switch based on the switching control signal and the measured voltage between the source electrode and the drain electrode.

5. The solid state circuit breaker of claim 4, wherein the short circuit occurs on the solid state switch when the switching control signal is a low level and the measured voltage between the source electrode and the drain electrode is zero.

6. The solid state circuit breaker of claim 1, further comprising a second voltage measurement device configured to measure a voltage of two terminal of the inductor; and wherein the fault detection circuit is further configured to detect whether an open circuit occurs on the solid state switch based on the measured voltage of two terminals of the inductor, a reference voltage, and the switching control signal.

7. The solid state circuit breaker of claim 6, wherein:
the fault detection circuit comprises a comparator configured to compare the measured voltage of two terminals of the inductor with the reference voltage and output a comparison result; and
the fault detection circuit is configured to detect whether the open circuit occurs on the solid state switch based on the comparison result and the switching control signal.

8. The solid state circuit breaker of claim 7, wherein the fault detection circuit comprises:
a logic gate circuit;
a first RESET/SET (RS) trigger connected with the comparator via the logic gate circuit; and
a second RS trigger connected with a gate driving circuit of the switching control signal via the logic gate circuit.

9. The solid state circuit breaker of claim 8, wherein:
a reset terminal of the first RS trigger is connected with the logic gate circuit and a set terminal of the first RS trigger is connected with the gate driving circuit of the switching control signal;
a reset terminal of the second RS trigger is connected with the logic gate circuit and a set terminal of the second RS trigger is connected with a gate driving circuit of a reverse signal of the switching control signal; and
the fault detection circuit is configured to detect whether the open circuit occurs on the solid state switch according to logic levels of an output terminal of the first RS trigger and an output terminal of the second RS trigger.

10. The solid state circuit breaker of claim 9, wherein the logic gate circuit comprises:
a first NOT gate having an input terminal connected with the gate driving circuit of the switching control signal;
a first NAND gate having a first input terminal connected with an output terminal of the comparator and a second input terminal connected with the gate driving circuit of the switching control signal;
a second NAND gate having a first input terminal connected with the output terminal of the comparator and a second input terminal connected with an output terminal of the first NOT gate;
a second NOT gate having an input terminal connected with the output terminal of the second RS trigger;
a third NOT gate having an input terminal connected with the output terminal of the first RS trigger;
a first OR gate having a first input terminal connected with an output terminal of the first NAND gate, a second input terminal connected with an output terminal of the second NOT gate, and an output terminal connected with the reset terminal of the first RS trigger; and
a second OR gate having a first input terminal connected with an output terminal of the third NOT gate, a second input terminal connected with an output terminal of the second NAND gate, and an output terminal connected with the reset terminal of the second RS trigger.

11. The solid state circuit breaker of claim 6, wherein:
the fault detection circuit further comprises a delay circuit configured to delay the switching control signal to obtain a delayed switching control signal; and
the fault detection circuit is configured to detect whether the open circuit occurs on the solid state switch based on the measured voltage of two terminals of the inductor, the reference voltage, and the delayed switching control signal.

12. The solid state circuit breaker of claim 11, wherein the delay circuit comprises:
a first branch and a second branch connected in parallel, wherein the first branch comprises a first diode and a first resistor connected in series and the second branch comprises a second diode and a second resistor connected in series in reverse to the first branch; and
a capacitor connected with the first and the second branches.

13. A motor driving system comprising:
an electrical motor;
a power source for providing a DC voltage; and
a solid state circuit breaker coupled between the electric motor and power source, the solid state circuit breaker comprising:
a solid state switch having a gate electrode, a source electrode, and a drain electrode;
an inductor connected in series with the solid state switch;
a gate driving circuit configured to supply a switching control signal to the gate electrode;
a voltage measurement device configured to measure a voltage between the source electrode and the drain electrode; and
a fault detection circuit configured to detect whether an overheating fault occurs on the solid state switch based on the switching control signal and the measured voltage between the source electrode and the drain electrode, the overheating fault occurring when the switching control signal is a high level and the measured voltage between the source electrode and the drain electrode is greater than a predetermined voltage threshold.

14. The motor driving system of claim 13, wherein the fault detection circuit comprises a field programmable gate array for outputting a string of codes.

15. The motor driving system of claim 13, wherein the fault detection circuit detects whether the overheating fault occurs on the solid state switch based further on a curve of a resistance between the source electrode and the drain electrode versus a temperature of the solid state switch.

16. The motor driving system of claim 13, further comprising a DC/AC converter coupled between the solid state circuit breaker and the electric motor.

17. A solid state circuit breaker comprising:
a solid state switch having a gate electrode, a source electrode, and a drain electrode;
an inductor connected in series with the solid state switch;
a gate driving circuit configured to supply a switching control signal to the gate electrode;
a voltage measurement device configured to measure a voltage of two terminals of the inductor; and
a fault detection circuit comprising a comparator configured to compare the measured voltage of two terminals of the inductor with a reference voltage and output a comparison result, the fault detection circuit configured to detect whether an open circuit occurs on the solid state switch based on the comparison result and the switching control signal.

18. The solid state circuit breaker of claim 17, wherein the fault detection circuit comprises:
a logic gate circuit;
a first RESET/SET (RS) trigger connected with the comparator via the logic gate circuit; and
a second RS trigger connected with a gate driving circuit of the switching control signal via the logic gate circuit.

19. The solid state circuit breaker of claim 18, wherein:
a reset terminal of the first RS trigger is connected with the logic gate circuit and a set terminal of the first RS trigger is connected with the gate driving circuit of the switching control signal;
a reset terminal of the second RS trigger is connected with the logic gate circuit and a set terminal of the second RS trigger is connected with a gate driving circuit of a reverse signal of the switching control signal; and
the fault detection circuit is configured to detect whether the open circuit occurs on the solid state switch according to logic levels of an output terminal of the first RS trigger and an output terminal of the second RS trigger.

20. The solid state circuit breaker of claim 17, wherein:
the fault detection circuit further comprises a delay circuit configured to delay the switching control signal to obtain a delayed switching control signal; and
the fault detection circuit is configured to detect whether the open circuit occurs on the solid state switch based on the measured voltage of two terminals of the inductor, the reference voltage, and the delayed switching control signal.

* * * * *